United States Patent [19]

Lapeyre

[11] Patent Number: 4,994,992
[45] Date of Patent: Feb. 19, 1991

[54] CONTOURED TOUCH TYPE DATA PROCESSING KEYBOARD

[75] Inventor: James M. Lapeyre, New Orleans, La.

[73] Assignee: The Laitram Corporation, New Orleans, La.

[21] Appl. No.: 327,422

[22] Filed: Mar. 21, 1989

Related U.S. Application Data

[63] Continuation of Ser. No. 850,565, Apr. 11, 1986, abandoned, which is a continuation of Ser. No. 493,613, May 11, 1983, abandoned, which is a continuation-in-part of Ser. No. 488,692, Apr. 26, 1983, Pat. No. 4,549,279.

[51] Int. Cl.$^5$ .............................................. G06F 3/023
[52] U.S. Cl. ............................................. 364/709.15
[58] Field of Search ...................... 364/709.15; 341/27

[56] References Cited

U.S. PATENT DOCUMENTS

| 3,225,883 | 12/1965 | Ayres | 340/365 R |
|---|---|---|---|
| 3,892,958 | 7/1975 | Tung | 364/709 |
| 3,955,074 | 5/1976 | Rodé et al. | 364/709 |
| 3,967,273 | 6/1976 | Knowlton | 340/365 R |
| 4,042,777 | 8/1977 | Bequaort et al. | 179/79 |
| 4,067,431 | 1/1978 | Whitaker | 340/365 R |
| 4,202,038 | 5/1980 | Petersson | 364/709 |
| 4,272,826 | 6/1981 | Deutsch | 340/365 R |
| 4,360,892 | 11/1982 | Endfield | 178/17 C |
| 4,400,593 | 8/1983 | Kunz | 340/365 R |
| 4,412,210 | 10/1983 | Washizuka et al. | 364/709 |

FOREIGN PATENT DOCUMENTS

| 490000 | 8/1938 | United Kingdom | 364/709 |
|---|---|---|---|
| 511240 | 8/1939 | United Kingdom | 364/709 |

OTHER PUBLICATIONS

Beausoleil et al., "Compact Keyboard", *IBM Tech. Disclosure Bulletin*, vol. 13, No. 11, Apr. 1971, p. 3574.

*Primary Examiner*—David H. Malzahn
*Attorney, Agent, or Firm*—Laurence R. Brown

[57] ABSTRACT

Typically twelve keys are arranged for one-hand touch typing in alphanumeric data processors permit a single finger to choose either single keys or multiplicities of side-by-side keys to give enough selection for alpha processing and to arrange keys conveniently about the fingers for touch typing. Tactile feedback structural patterns including indentations and raised surface portions identify single keys and intersections of two and three keys where the finger strokes occur. By providing three key intersections a larger number of different selections of input data characters or control functions may be entered with fewer keyboard keys.

4 Claims, 5 Drawing Sheets

FIG. 2

CONTOURED TOUCH TYPE DATA PROCESSING KEYBOARD this application is a continuation of application Ser. No. 06/850,565 filed Apr. 11, 1986, now abandoned, which was a continuation of application Ser. No. 06/493,613 filed May 11, 1983, now abandoned, which in turn is a continuation-in-part of application Ser. No. 06/488,692 filed Apr. 26, 2983, now U.S. Pat. No. 4,549,279 granted Oct. 22, 1985 entitled Improved Manual Data Entry in Data Processing System.

TECHNICAL FIELD

This invention relates to electronic data processing equipment and more particularly it relates to keyswitch type manual entry keyboards for both entry of data and functional control of data processing operations.

BACKGROUND ART

A significant bottleneck in the use of electronic computers and other data processing equipment is the human input interface equipment usually in the form of keyboards. Modern electronic data processors have outstripped the capacities of conventional keyboards by providing capability for handling literally hundreds of control functions and data characters on a single low cost chip. Also any manual input keyboard is sensitive to manual input speed and potential entry errors caused by either equipment characteristics or human error. The need for improved speed, accuracy and high data handling capacity in manual entry keyboards is evident. A further desirable feature is minimal size compatible with portable size computers, which constitute a considerable percentage of the market demand. For small keyboard panels of the prior art there is generally only room for operation by one hand, which further tends to restrict keyboard speed, accuracy and capacity.

Some prior art techniques are proposed to increase keyboard capacity for data processing applications, such as (1) the "chord" system of selection of keys either one or several at a time set forth in U.S. Pat. No. 4,042,777—F. C. Bequaert et al.—Aug. 16, 1977 or German Pat. No. 2924515 — Jan. 15, 1981, (2) the use of the available keyboard keys in several different modes as set forth in U.S. Pat. No. 3,892,958—C. C. Tung—Jul. 1, 1975 and (3) the use of counted sequential closures of keys a plurality of times to provide a larger number of selections per key as set forth in U.S. Pat. Nos. 4,202,038—S. A. Petersson—May 6, 1980 and 4,272,826—S. Deutsch—Jun. 9, 1981. However, these keyboards all tend to increase the error rate of manual input data by requiring the operator to make mental choices including those which select how many fingers and how many finger strokes are required for an entry. The same is true if a keyboard has a larger number of keys so that an operator's hands get out of register for touch operation, or must have a large reach or hand movement span encompassing a large number of keys.

It is therefore an objective of this invention to improve the manual entry data processor keyboard art by providing structure to reduce errors, improve capacity and increase speed.

DISCLOSURE OF THE INVENTION

This invention provides electronic keyboard switching equipment for manual data entry and control of electronic computer and data processing equipment that permits faster more accurate manual input of data. Also, high keyboard capacity is achieved in a compact size to compatibly relate to modern chip and portable sized computer requirements and thereby make available an extensive range of the available built-in data processing functions.

One significant factor in producing fast and error free manual keyswitch entry is the provision of an interacting set of elements eliminating mental choices of the operator to determine which selection to make or which set of fingers to use. If a piano player first attempts to play rapidly a new song without practice it would be difficult to play all chords without error because of the mental process in choosing the number and locations of the necessary fingers. Rather a typist sequentially using one finger at a time to enter one character at a time can rapidly type new text with a mechanical action that substantially eliminates errors. This then is the limited mode of operation provided by this invention together with other cooperating keyboard features that also result in comprehensive choice of many selections, rapid data production and few errors.

To significantly increase the key-to-signal selection efficiency, a single finger stroke may choose the individual keys one at a time plus a large number of "virtual" keys afforded by stroking two or more side-by-side keys simultaneously.

It is significant to a typist or other keyboard operator to be able to find and rest the fingers in a ready home position from which the finger reach provides access to the entire keyboard. Thus, an error reducing feature is incorporated and accented by this invention by means of producing a keyboard contour that lets the fingers feel by touch that they are in home position or on a correctly selected key when reaching out. This tactile feedback also supplements the movement of the keyswitch for each entry so that the operator knows one character is complete and another may immediately follow. This feature is characterized by tactile feedback markers to be sensed by a single finger in each entry position showing that the finger is registered in place for the entry, wherein the markers extend over a plurality of at least two side-by-side keys to encompass those entries which result from simultaneous switching of more than one keyswitch. The tactile markers comprise an ordered set of indentations, raised ridge surface portions and flat surface areas, which typically respectively identify selections for the finger position to actuate one, two or more keyswitches. To accommodate tiered row typewriter type keyboards, the tiering overlaps the keys in an adjacent row to permit a single finger stroke actuation of keys in two adjacent tiered rows.

A preferred keyboard arrangement for one hand touch type entry of alphanumeric data has twelve keys arranged in five columns of keys, which overlap to fit the length of the five fingers on a hand, and thus match a home key position with a normal natural hand posture.

Indicia entered on the keyboard permits visual reference, particularly useful for unusual or less frequently used selections. This is also important if a plurality of different live keyboard modes is available and makes the keyboard selections in different modes self-explanatory without reference to an instruction manual.

Compact size and full alphanumeric entry capacity of each entry with a single finger stroke using a single hand and as few as nine keys is achieved by use of the technique of letting a finger bridge more than one key for concurrent switching of more than one keyswitch per finger stroke, when provision is made for a mode change to select more than one live keyboard set. Direct entry of each character is provided by a single finger stroke on a live keyboard so that high data entry speed is achieved. A twelve key keyboard can provide for example from 47 to 55 separate selections for full alphanumeric capabilities and further choice of a number of functional control signals on a live keyboard. A greater number of keys further expands the number of selections possible without any change of the keyboard mode.

This invention therefore makes it possible with a compact twelve key symmetrical matrix array commonly used for telephone service to attain a full alphabetic mode of 35 characters supplementing the standard twelve choice numerical mode telephone key switch assembly. Thus, forty-seven separate tones can be used and this array is useful in telephone switching systems to replace complex PBX type switchboards.

Other features, objects and advantages of the invention will be found throughout the description, drawing and claims.

THE PREFERRED EMBODIMENTS

Figure 1:
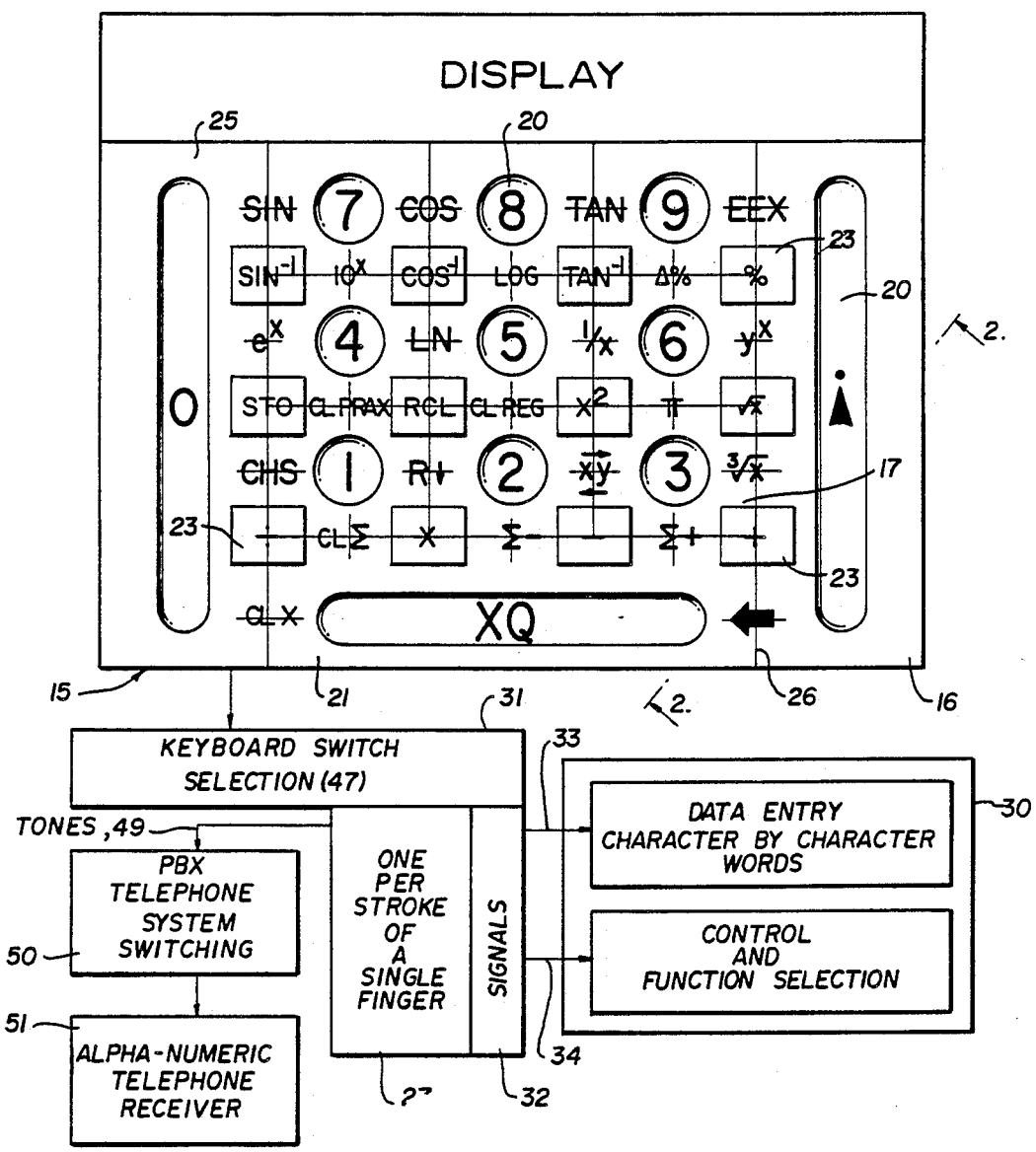
FIG. 1 is a sketch of a data processing system partly in block diagram with a manual entry keyboard for entering data and control signals in accordance with the provisions of this invention.

As laid out in FIG. 1, a single field 15 of twelve side-by-side manually operable keyswitches 16, 17, etc. provides both input data and operating instructions for a computer or other data processing system, preferably self contained in an appropriate housing such as a portable or desk top sized case. The pertinent data processing-keyboard relationships are shown in block diagram form and a visual display panel 18 is available for output interfacing. The keyboard is operable live with the keyboard indicia showing available functions and characters selectable. In this case a numerical calculating mode of operation permits digit by digit sequential direct entry by means of a single stroke by a single finger of an appropriate one of the decimal digit keyswitches designated 0 to 9 in the circle or oblong key fitting depressions 20 shown better by the profile view of FIG. 2. Note that the symmetry of the layout provides one hand operation by either right or left hands.

For control purposes, key 16 provides for a decimal point entry for the first occurrence in a numerical word. However, for the second such entry in a word (a non-meaningful combination) it will serve as a control function to enter the word into an appropriate register as indicated by the arrow designation. The execute (XQ) key 21 is used to execute command instruction such as for example, to change the computer mode of operation and establish a different set of entries for the live keyboard keys as more completely described in my copending application Ser. No. 459,998 filed Jan. 21, 1983 for Computer Keyboards With Few Keys Designating Hundreds of Functions.

Figure 2:
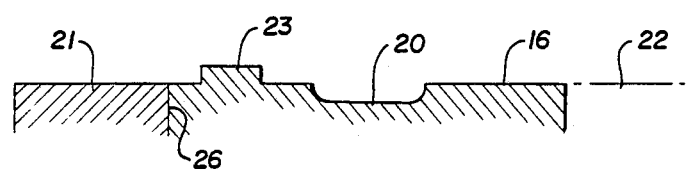
FIG. 2 is a partial section sketch showing keyboard profile features afforded by this invention as seen from lines 2—2 of FIG. 1.
Figure 3:
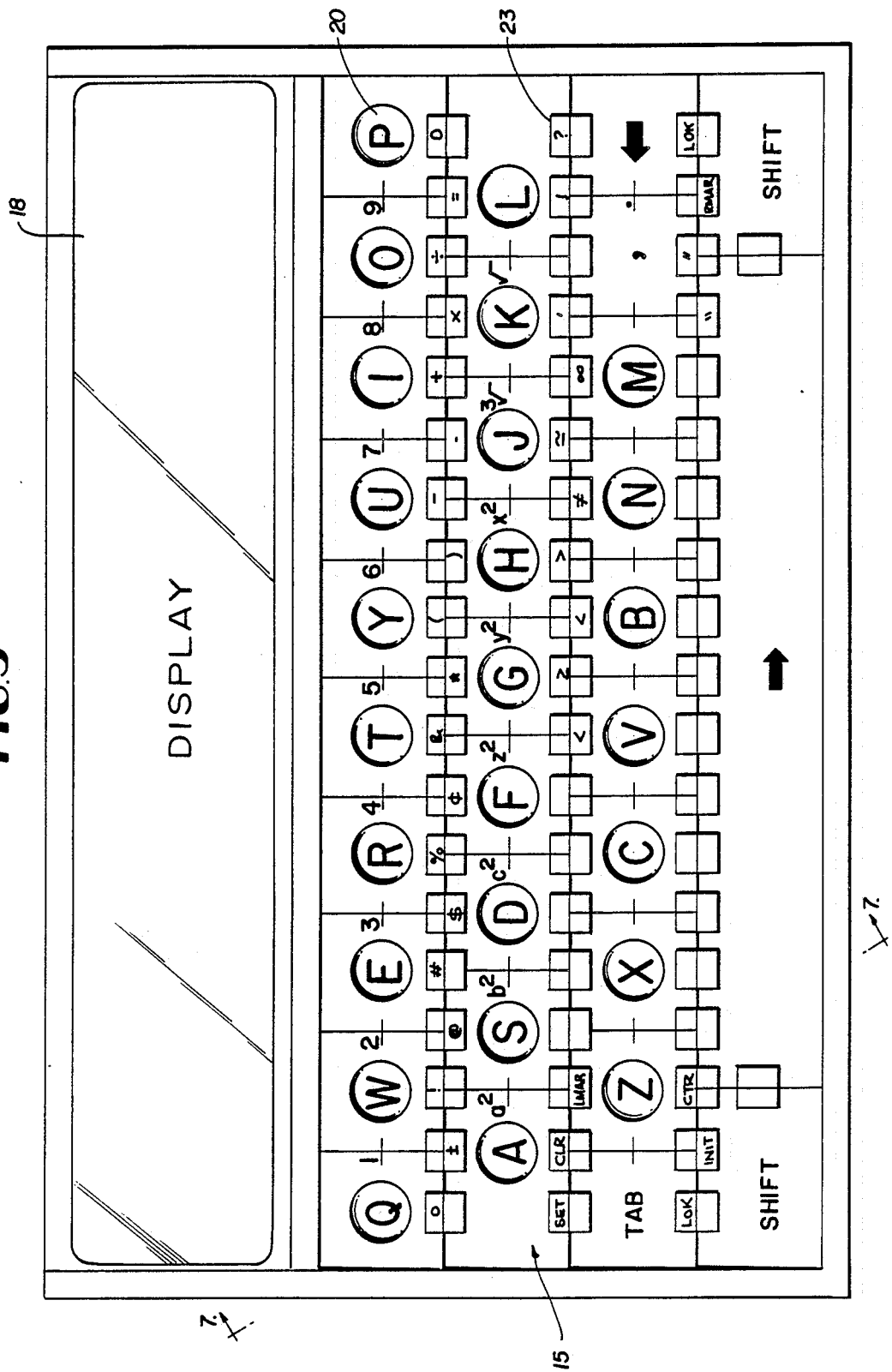
FIG. 3 is a plan view of a keyboard and display embodiment of the invention for manual entry of alphanumeric data with keyswitches laid out in a conventional typewriter keyboard pattern.

Basically this keyboard embodiment has contiguous keys disposed in a field presenting generally a flat surface plane (22, FIG. 2). That surface is contoured by depressions 20 and by raised surface portions 23 which can be felt to aid in touch selection of keyboard entries. Thus, the field of twelve keys is operated by one hand as a typewriter using a single finger for each entry to close a keyswitch (or to concurrently close a combination of keyswitches). The depressions 20 and raised surfaces 23 thus permit the operator to feel the proper finger positions and to know when the fingers are resting in a home position or reaching to the right finger position for entries from a single keyswitch closure. A home position thus in the depressions would be as follows: thumb at 0, index finger at 4, forefinger at 5, ring finger at 6 and little finger at the decimal point.

Each depression thus relates to a single keyswitch actuable by a single finger stroke and the tactile depression markers 20 will feedback to the operator the proper finger position for entries of a single keyswitch closure. The "Virtual" keys of two or more keyswitches simultaneously closed, are also identified by tactile feedback structure. Thus, junctions of two side-by-side keys, including sin 14, $\pi$ and the like, are arranged on a flat surface junction line which is felt by the operator when the finger is in place for a key stroke of this set of virtual (two simultaneous keyswitch single) keys. Similarly, the set of virtual keys for more than two simultaneous keyswitch closures by a single finger stroke are located at the raised ridges 23, which are felt by the operator to assure that the finger is properly registered.

Note that for the virtual keys a tactile feedback member is provided common to two or more keys by extending over a plurality of at least two side-by-side keys. Thus, the operator can "type" with greater accuracy and select with confidence the many key positions available from the set of twelve keyswitches.

If the number of keyswitches is 12 as for example disposed in this keyboard embodiment, as may be seen in FIG. 1, forty-seven entry selections are provided. This is achieved by providing output signals in response to actuation of either the twelve single keys independently (0–9, XQ and .) or the actuation of a plurality of keys concurrently.

Figure 6:
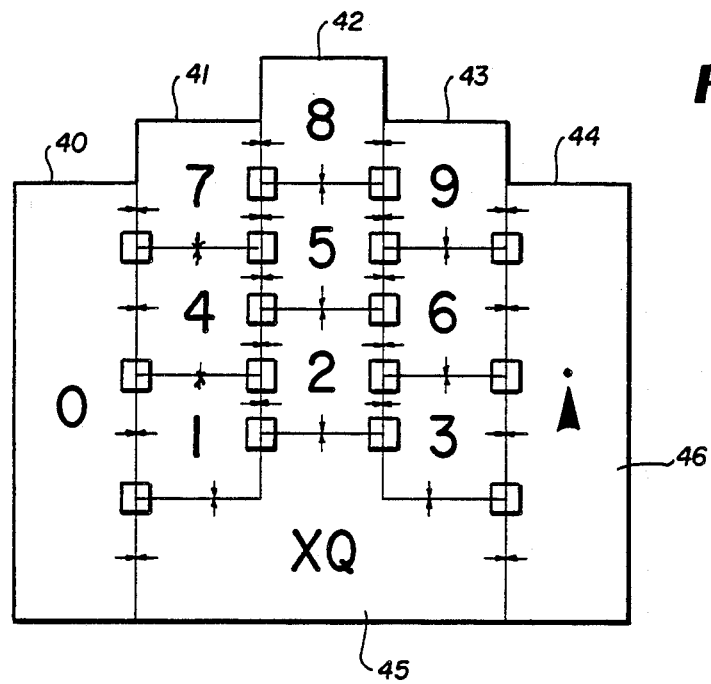
FIG. 6 is a plan view of a twelve key keyboard embodiment with five rows of keys interlaced to fit the natural position of the fingers, thereby to reduce errors and permit comfortable data entry.

In the format of FIG. 6 by offsetting columnar keys, the number of selections available from twelve keys is increased to 55. This further adds the desirable feature of conforming the five columns of the keyboard to fit the normal contour of the human hand, where the forefinger is the longest, etc. Thus, a natural home position will further prevent any errors caused by unnatural hand positions required in other keyboard configurations.

It is important for accuracy and speed in manual data entry that the individual characters be selected sequentially one at a time by choice of a single finger as indicated on box 27 (FIG. 1). Thus, two side-by-side keys such as shown for clear X (c1X) at the intersection of keys 21 and 25 are operated concurrently by a single finger stroke. All of these two concurrent key selection positions are at medium level coplanar (flat) surface finger stroke positions at the junctions where only two keys meet, in accordance with the preferred contour embodiment of FIG. 1. See the junction line 26 of keys 21 and 16 in FIG. 2, for example, where the back space/clear arrow indicia is seen in FIG. 1. Other selections such as sin, cos are evident from the twelve key field embodiment as displayed. The touch at a flat surface joint between keys is readily recognized by an operator as a feedback signal assuring that the fingers are in proper position.

Also a plurality of 3 or 4 keyswitches may be stroked concurrently by a single finger with a single stroke for an entry. These locations are identified by a raised surface rectangle ridge 23 (see FIG. 2 also). Thus, for example, divide ($\div$) or percentage (%) control functions are selected at three key junctions, and $X^2$ for example is selected at a four key junction. Thereby a number of selections far in excess of the number of key switches is provided in this system. The system also affords manual data input speed and accuracy not heretofore available by means of combining the contoured keyboard and the entry of a large number of characters or functions with a single finger stroke to permit touch type data entry in a mode similar to touch typewriting. Note that the maximum reach for selecting characters away from a home finger rest position (0-4-5-6-.) is significantly reduced by the use of the technique of bridging side-by-side keys with the acting data input finger and keeping the side-by-side keys in a single compact field. This means the hand can span a much larger number of key entry positions than on a typewriter type keyboard, for example. Also note that because of the more closely spaced character positions, the contoured keyboard markers are most important in reducing the probability of error, since each class of keyswitch entry (1, 2, 3 keys, etc.) will have its own feel in terms of indentation, flat surface or raised marker ridge. A special texture may be placed at the flat surfaces if desired for more prominent differentiation from other flat keyboard areas out of register. Thus, both the movable keyswitches which must be actuated and the marker feel are feedback signals to the operator to improve the data input accuracy.

The switchboard is readily adapted to communicate with the data processor system 30 by means of a logic decoding switch selection network 31. Thus 47 different signals are derived for the various keyswitch selections on keyboard 15 of FIG. 1 and validated as proper keyswitch combinations. The signals for actuating the data processing then comprise a sequence of successive signals selected for each finger stroke (27) and coupled (32) to the data processing system 30 in proper coded form for communication. Thus, both data in the form of characters for forming data entry words (33) and control of function signals (34) are entered by a single finger in a single keystroke.

The keyboard layout may take other forms, such as the conventional two hand typewriter layout pattern having at least twenty-eight separate keys for producing the full alphabet. As seen by the keyboard notation, the flat or tiered (FIG. 7) keyboard surface has depressions 20 and raised ridge portions 23 as in the hereinbefore described contour pattern. In this embodiment, the rows of keys are interlaced to form three key intersections at the contoured positions 23. It is readily apparent that great flexibility of control for a data processing system is provided by this keyboard layout, where space is available. It has the advantage of a standard keyboard layout for two handed typing, but permits a large range of additional live keyboard functions and provides the contour tactile feedback feature.

Figure 4:
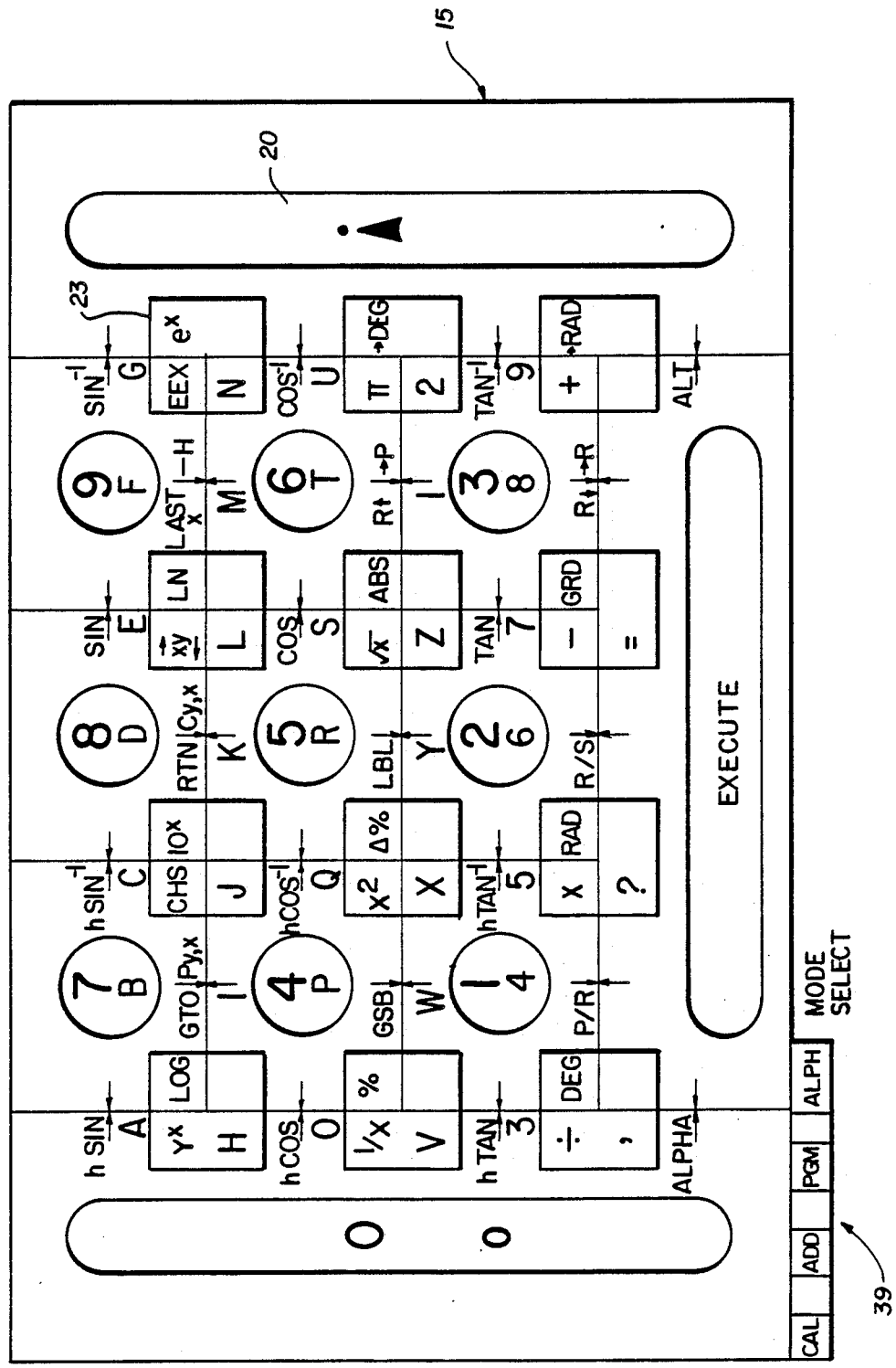
FIG. 4 is a further keyboard embodiment as shown in FIG. 1 illustrating the use of the live keyboard switches in a multiplicity of modes including numeric calculation and alphanumeric modes.

The twelve key layout of FIG. 4 illustrates the comprehensive capabilities of the keyboard system of this invention to effectively use more of the very large number of data processing functions available on modern chips. For illustrative purposes, three different modes of operation are outlined, as may be seen best from the three separate notations on the multiple key intersections with the raised contours 23. For convenience to an operator, the three sets of indicia may be color coded, black, blue and red, for example.

The data processing system is then operated in three modes, such as an alphanumeric data processing mode, a numeric calculating mode, and other specialty modes such as adding machine (ADD) and programming (PGM) modes, as selected by appropriate commands generated from the keyswitches. In this embodiment auxiliary mode selector switches 39 are illustrated. It is seen from the keyboard notation that in the alphanumeric mode, the entire alphabet, all ten decimal digits, punctuation marks, and several command signals are available for one hand entry from the twelve keyswitches. In each mode therefore the keyboard signals are coupled to the data processing system for corresponding communication from a live keyboard, so that each stroke of a single finger will produce a valid entry.

Figure 5:
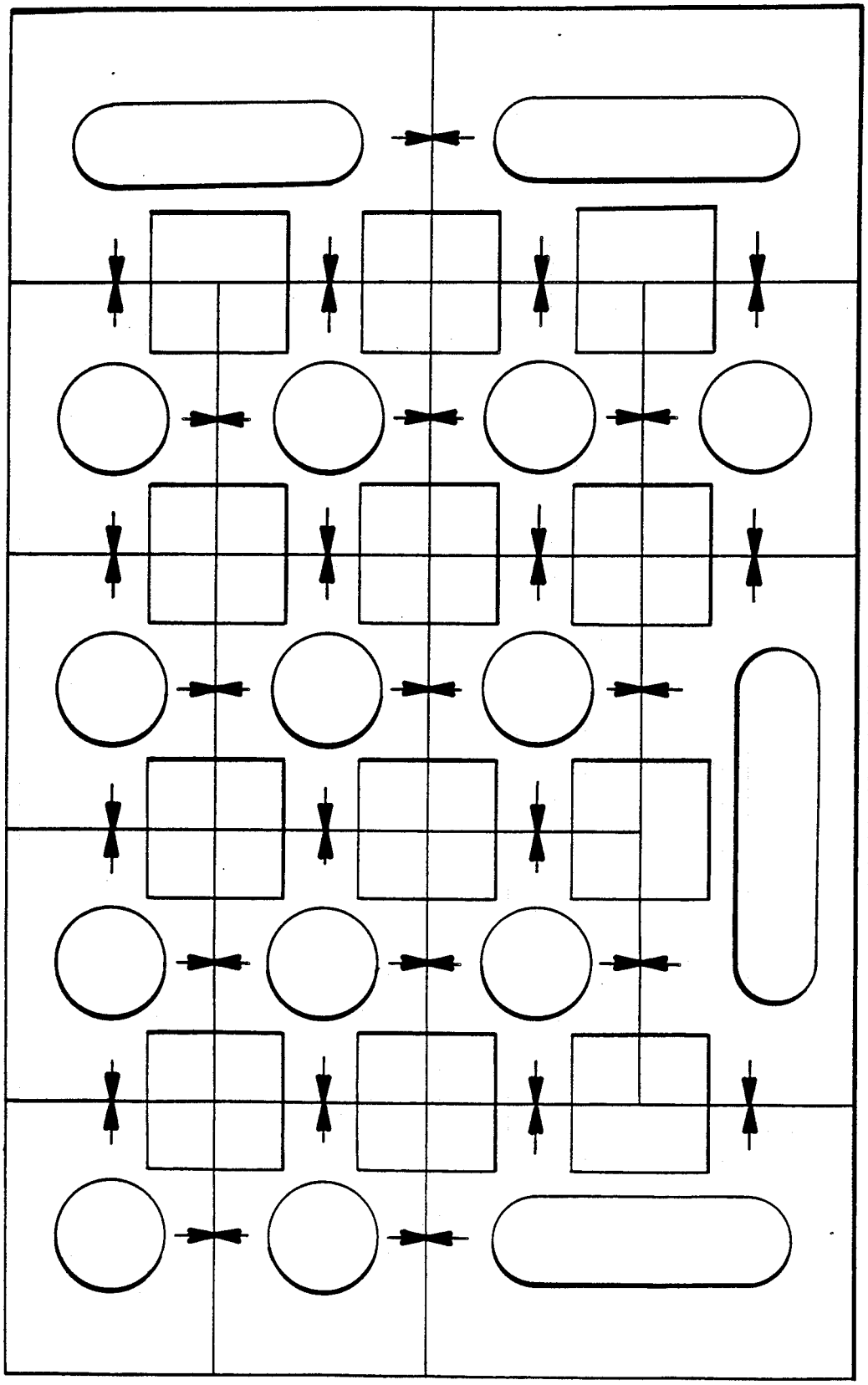
FIG. 5 is an alternative keyboard pattern embodiment with sixteen keys arranged for manual data entry by one hand.
Figure 8:
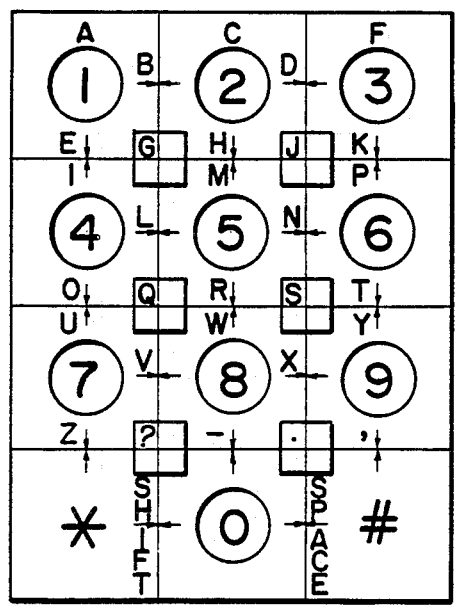
FIG. 8 is a plan view of a twelve key symmetrical matrix keyboard layout of the type commonly used in telephone systems.

Other keyboard formats may be desired, such as for example, the twelve key telephone type keyboard of FIG. 8 or the sixteen key version of FIG. 5. In each case, the keyboard is located in a single field and is preferably accessible by one hand leaving the other free for other purposes. By placing all the keys in a single field, a greater number of keyswitch combinations is available. Also, the keyswitch layout then can be designed for fewer mental choices by the operator, thereby decreasing error rates. Also to decrease the error rate and provide essentially mechanical entry of data even from unrehearsed copy, each entry is made in sequence by action of a single finger, as in touch typewriting. It is seen therefore that accurate, high speed data and control function entry is achieved very efficiently and comprehensively with few keys.

In FIG. 6, the keyboard assembly comprises a field of twelve keys arranged in five columns 40–44 symmetrically layed out for either left or right hand operation by a single hand. As seen from the home keys (0-4-5-6-.), the column keys are offset and interlaced. This serves two important purposes, namely it provides a larger number of virtual keys so that 55 choices are available from twelve keys and it conforms to the normal contour of the human hand to make use more comfortable and more error free to avoid errors caused by fatigue or reach from or to an unnatural position of the fingers.

As may be seen the longer forefinger is accommodated by centermost offset column 42, whereas, index and ring fingers naturally meet and rest on columnar keys 41 and 43. The thumb and little fingers being the shortest then can find a position on the columns 40, 44. To conform to the offset columns the execute key 45 spans the three centermost columns. When this keyboard is used for telephone input, the two keys 45, 46 may carry * and # notation.

Figure 7:
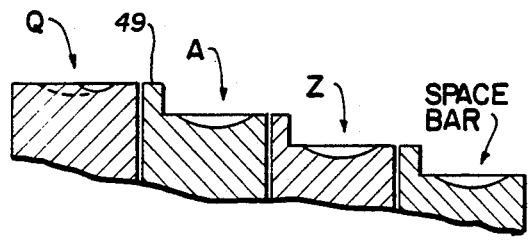
FIG. 7 is a profile sketch of the keyboard of FIG. 3 when tiered, as taken along lines 7—7, wherein keys in lower rows have portions extended to the adjacent higher level rows thereby to permit a single finger stroke to actuate simultaneously keys in two adjacent rows.

FIG. 7 illustrates the key construction in profile sketch of a tiered keyboard such as the typewriter keyboard of FIG. 2, as afforded by this invention.

Thus, each key on a lower one of the tiered rows has a raised edge portion 49 thereof extending into the adjacent upper tier to permit by a single fingerstroke the virtual key selection for simultaneously closing keyswitches located in two adjacent rows or tiers.

In accordance with this invention therefore another embodiment as shown in FIG. 8 is particularly adapted for telephone use where a similar field arrangement of twelve keys is employed. Note that for special keyboards the use of nine keys can be used to provide twenty-five selections from nine keys and sixteen virtual keys, such as in telephone switchboard (PBX type) services where ten numerical digits are required plus control and switching signals. The twelve key layout with thirty-five selections shows that full alphabetic capabilities are feasible in telephone communications provided a mode change of the live keyboard functions from numeric to alphabetic mode is supplied, such as by operation of the # key.

If the system diagram of FIG. 1 is considered, it is seen that this invention provides improved telephone switching systems. For example, the keyboard switch selection device 31 may produce tones compatible with telephone line transmission in response to key selections from keyboard 15 (or that of FIG. 8). As seen from cable 49 these tones (up to forty-seven in number) are processable in the telephone system switchboard 50 which can connect in a telephone receiving station 51 (such as a computer) for handling alphanumeric data input. This keyboard assembly constitutes what is known in the art as a simple modem. Also it is seen that this invention permits a complex PBX type of switchboard used in telephone switching systems to be replaced by a simple twelve key standard telephone keyswitch assembly that produces an equivalent function that formerly required a large number of keyswitches while processing numerical data entires in a conventional way.

Having therefore advanced the state of the art, those novel features believed descriptive of the spirit and nature of the invention are set forth with particularity in the claims.

I claim:

1. In a touch type data processor keyboard assembly system of the type having a field of side-by-side keys arranged on a keyboard field for selective manual actuation by the stroke of a single finger of either selected keys individually or multiplicities of simultaneously actuated keys of side-by-side keys arranged in said field by bridging the multiplicity of keys with a single finger, the improvement comprising:

said field of side-by-side keys presenting respectively (1) a generally flat keyboard surface plane, (2) variations from the flat keyboard surface comprising contoured surface areas defining first tactile feedback pattern means departing form the keyboard field flat surface to define a first set of finger rest positions for stroking a plurality n of said multiplicity of keys simultaneously with a single fingerstroke, and (3) further variations from the flat keyboard surface comprising a second different type of contoured surface pattern means departing from the keyboard field flat surface to define a second set of finger rest positions for stroking a different number than n of said keys comprising second tactile feedback pattern means on the keyboard flat surface defining a further set of finger rest positions.

wherein the second said pattern means comprises on predetermined keys indentations inwardly from said flat keyboard surface and the first said pattern means comprises raised surface portions extending from said keyboard surface, a pattern of said variations and keys positioned in said field of side-by-side keys to define in said first set of finger rest positions means for stroking simultaneously by a single finger two keys at intersections of two keys and at least one further set of finger rest positions for stroking simultaneously by a single finger three keys at intersections of three keys, surface contour structure on the flat keyboard surface defining said indentations in individual keys for identifying single keys for locating said second set of finger rest positions on the keyboard surface, surface contour structure on the flat keyboard surface defined by the intersections of two side-by-side keys to identify said first set of finger rest positions for bridging and actuating said set of two simultaneously stroked keys, and surface contour structure on the flat keyboard surface defining the raised surface portions of said first pattern means at finger stroke positions for actuating concurrently said three keys.

2. In a touch type data processor keyboard assembly system of the type having a field of side-by-side keys arranged on a keyboard field for selective manual actuation by the stroke of a single finger of either selected keys individually or multiplicities of simultaneously actuated keys of side-by-side keys arranged in said field by bridging the multiplicity of keys with a single finger, the improvement comprising:

said field of side-by-side keys presenting respectively (1) a generally flat keyboard surface plane, (2) variations from the flat keyboard surface comprising contoured surface areas on predetermined keys defining first tactile feedback pattern means departing from the keyboard field flat surface to define a first set of finger rest positions for stroking three of said multiplicity of keys simultaneously with a single fingerstroke, and (3) further variations from the flat keyboard surface comprising a second type of contoured surface pattern means departing from the keyboard field flat surface to define a second set of finger rest positions for stroking a single one of said multiplicity of keys comprising second tactile feedback pattern means on the keyboard flat surface defining a further set of finger rest positions, a structural arrangement of some of the keys in side-by-side columns with the keys offset to provide a plurality of common intersections of three keys identified by said finger rest positions, and data processing means for responding to a single finger stroking the finger rest positions of these three key intersections to provide individual signals for entry by the keyboard distinguished from response to single finger stroking of single keys or combinations of two keys, said keyboard assembly system having eleven keys arranged in columns and one additional key bridging at least three columns to define fifty-five of said finger rest positions.

3. In a touch type data processor keyboard assembly system of the type having a field of side-by-side keys arranged on a keyboard field for selective manual actuation by the stroke of a single finger of either selected keys individually or multiplicities of simultaneously actuated side-by-side keys arranged in said field by bridging the multiplicity of keys with a single finger, the improvement comprising:

three differing tactile feedback patterns placed in the keyboard field to define finger placement positions for actuating respectively one key, two keys simultaneously and more than two keys simultaneously wherein said patterns comprise keys of different surface configuration, wherein the three differing tactile feedback patterns constitute raised, indented and substantially flat surface configurations.

4. The keyboard assembly system of claim 3 wherein said more than two keys finger placement positions comprise intersections of three side-by-side keys in side-by-side columns of offset keys.

* * * * *